United States Patent [19]
Tateyama

[11] Patent Number: 5,970,717
[45] Date of Patent: Oct. 26, 1999

[54] COOLING METHOD, COOLING APPARATUS AND TREATMENT APPARATUS

[75] Inventor: Kiyohisa Tateyama, Kumamoto, Japan

[73] Assignee: Tokyo Electron Limited, Tokyo, Japan

[21] Appl. No.: 09/041,449

[22] Filed: Mar. 12, 1998

[30] Foreign Application Priority Data

Mar. 13, 1997 [JP] Japan .................................. 9-076685

[51] Int. Cl.$^6$ ................................................ F25B 21/02
[52] U.S. Cl. ................................ 62/3.2; 34/428; 34/429; 34/430; 34/433
[58] Field of Search ............................ 34/428, 429, 430, 34/433

[56] References Cited

U.S. PATENT DOCUMENTS

| | | | |
|---|---|---|---|
| 4,414,758 | 11/1983 | Peter et al. ................................. | 34/233 |
| 4,667,478 | 5/1987 | Jones, III .................................... | 62/64 |
| 4,777,733 | 10/1988 | Usuiwa et al. .............................. | 34/20 |
| 4,934,151 | 6/1990 | Shima ......................................... | 62/64 |
| 5,315,834 | 5/1994 | Garunts et al. ............................. | 62/78 |
| 5,551,165 | 9/1996 | Turner et al. ............................... | 34/404 |

*Primary Examiner*—Henry Bennett
*Assistant Examiner*—Mel Shulman
*Attorney, Agent, or Firm*—Foley & Lardner

[57] ABSTRACT

An apparatus is provided with a cooling unit for cooling a treatment substrate, a supporting body for supporting the treatment substrate before being transferred to the cooling unit and a cooling apparatus for cooling the treatment substrate supported by the supporting body. The apparatus cools the treatment substrate in a position where the treatment substrate stands by before being transferred into the cooling unit and thereafter cools the cooled treatment substrate in the cooling unit, which makes rapid and accurate cooling possible.

34 Claims, 6 Drawing Sheets

COOLING METHOD, COOLING APPARATUS AND TREATMENT APPARATUS

BACKGROUND OF THE INVENTION

1. Field of the Invention

The present invention relates to a cooling method and a cooling apparatus for cooling a treatment substrate such as a glass substrate or a silicon substrate and a treatment apparatus therewith.

2. Description of the Related Art

In the fabrication of a semiconductor device or a liquid crystal display (LCD), a circuit pattern is formed by what is called photolithography technology with the process described hereinafter. A photo-resist solution is coated on a semiconductor wafer that is a substrate or an LCD substrate to form a resist film which is subsequently exposed corresponding to the circuit pattern, and thereafter the circuit pattern is developed.

In the coating and developing process, when the resist film is formed, heat treatments including the pre-bake process for stabilizing the photo-resist, post-exposure bake process after exposure, post-bake process after development and the like are performed. Moreover, the cooling process for cooling the substrate of which the temperature is raised after the heat treatments is conducted.

When the substrate of which the temperature is raised after the heat treatments is cooled, heat exchange is conducted on a cooling plate that is a supporting body for supporting the substrate. More concretely, the substrate of which the temperature is raised is mounted on the cooling plate provided with pipelines for circulating cooling water. Heat exchange is conducted between the cooling water and the substrate, thereby lowering the temperature of the substrate.

However, since demand for shorter tact time in substrate treatments are increasing nowadays, the above-described cooling method can not satisfy the demands. In the above-described cooling method, when the tact time is shortened, the substrate after the aforesaid heat treatments is unable to be cooled to the predetermined temperature.

SUMMARY OF THE INVENTION

An object of the present invention is to provide a cooling method and a cooling apparatus for efficiently cooling a substrate and a treatment apparatus therewith.

Another object of the present invention is to provide a cooing method and a cooling apparatus for cooling a substrate at accurate temperatures and a treatment apparatus therewith.

A further object of the present invention is to provide a cooling method and a cooling apparatus for preventing electrostatic breakdown of a substrate and a treatment therewith.

The first aspect of the present invention is a method to cool a treatment substrate having the steps of cooling the treatment substrate in a position where the treatment substrate stands by before being transferred to a cooling unit, and cooling the cooled treatment substrate in the cooling unit.

The second aspect of the present invention is a method to cool a treatment substrate having the steps of cooling the treatment substrate while being transferred to a cooling unit, and cooling the cooled treatment substrate in the cooling unit.

The third aspect of the present invention is an apparatus for cooling a treatment substrate having a cooling unit for cooling the treatment substrate, a supporting body for supporting the treatment substrate before being transferred to the cooling unit, and a cooling means for cooling the treatment substrate supported by the supporting body.

The fourth aspect of the present invention is an apparatus for cooling a treatment substrate having a cooling unit for cooling the treatment substrate, a transferring means for transferring the treatment substrate to the cooling unit, and a cooling means for cooling the treatment substrate transferred by the transferring means.

The fifth aspect of the present invention is an apparatus for treating a treatment substrate having a first treatment unit group including a cooling unit for cooling the treatment substrate, a second treatment unit group for offering the treatment substrate the predetermined treatments, and a supporting body disposed between the first treatment unit group and the second treatment unit group for supporting the treatment substrate and a cooling means for cooling the treatment substrate supported by the supporting body.

According to the present invention, a treatment substrate is cooled in a position where the treatment substrate stands by before being transferred to a cooling unit and thereafter the cooled treatment substrate is cooled in the cooling unit, whereby rapid and accurate cooling becomes possible.

DESCRIPTION OF THE PREFERRED EMBODIMENTS

The preferred embodiments of the present invention will now be described with reference to the accompanying drawings.

Figure 1:
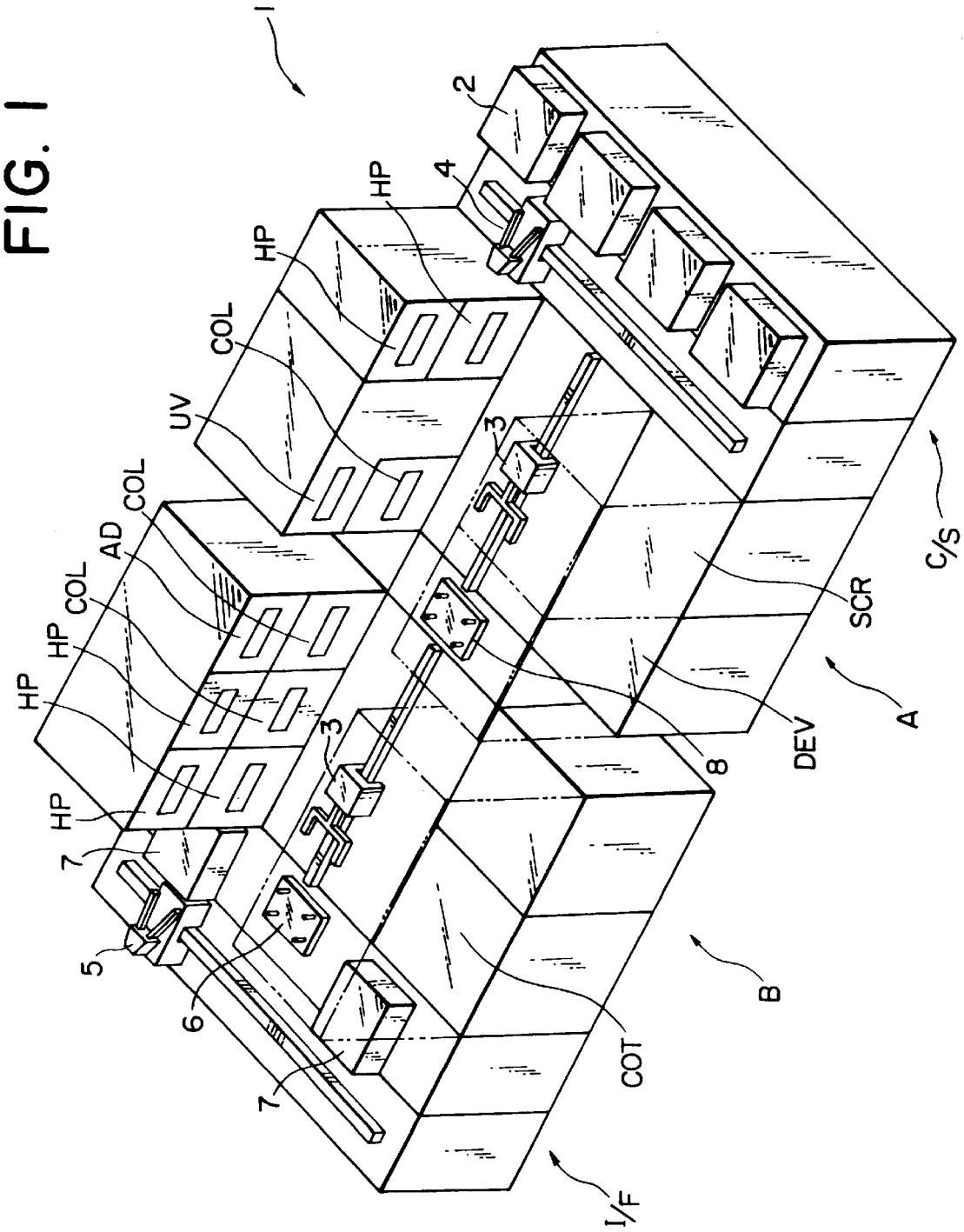
FIG. 1 is a perspective view showing a coating and developing apparatus according to an embodiment of the present invention.
Figure 2:
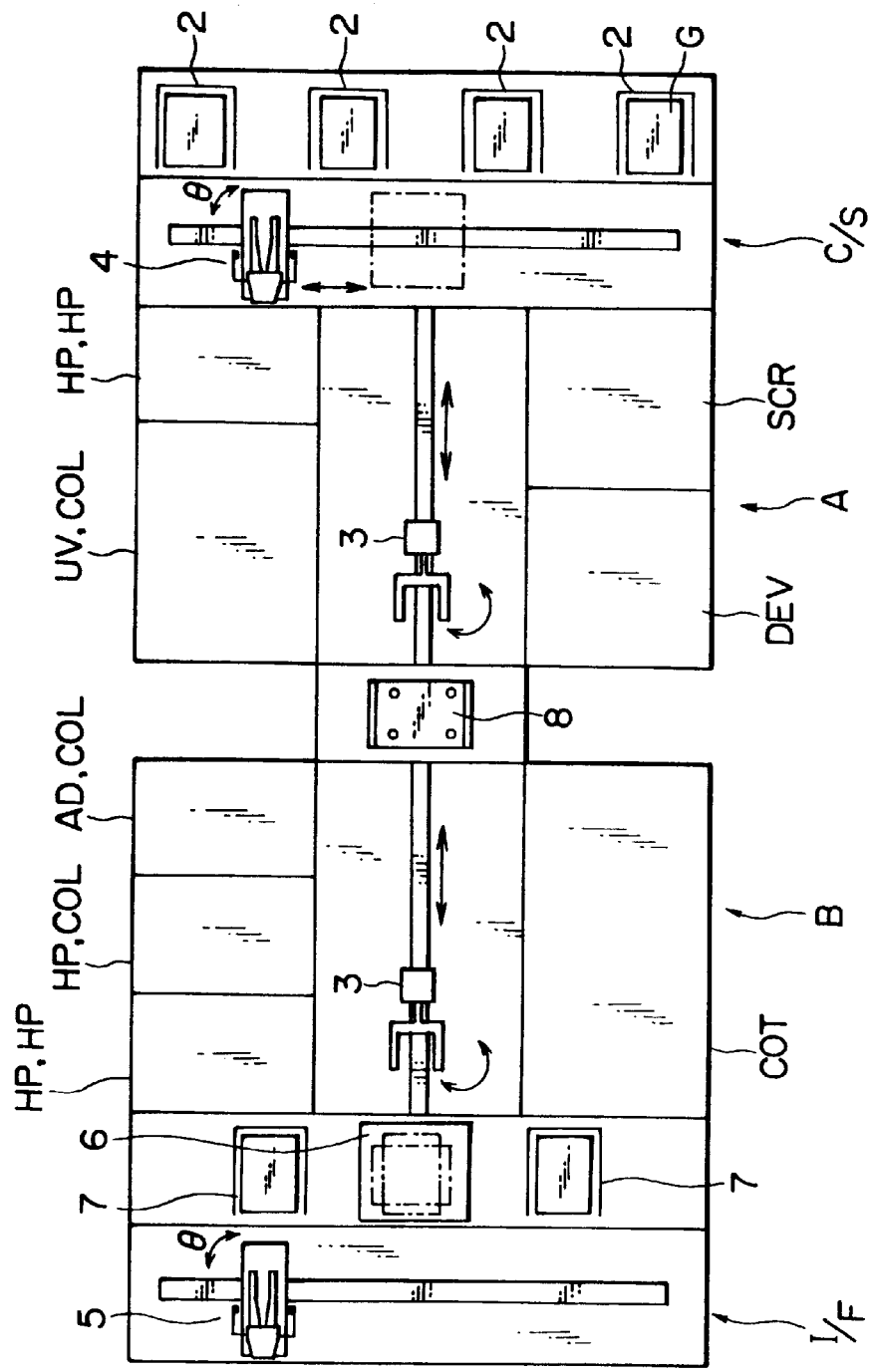
FIG. 2 is a plan view showing an apparatus shown in FIG. 1.

FIG. 1 is a perspective view showing a coating and developing apparatus according to an embodiment of the present invention. FIG. 2 is a plan view showing the apparatus shown in FIG. 1.

The coating and developing apparatus 1 is provided with a cassette station C/S on one side thereof. An interface unit I/F for sending and receiving glass substrates G to/from an exposing unit (not shown) is disposed on the other side of the coating and developing apparatus 1.

More than one, for example, four cassettes 2 containing substrates G such as substrates for LCD or the like are mounted on the cassette station C/S. An auxiliary arm 4 is disposed on the front side of the cassettes 2 on the cassette station C/S. The auxiliary arm transfers and positions the substrate G that is a treatment substrate, and in addition sends and receives the substrate G to/from the main arm 3 while holding the substrate G.

Mounted on the interface unit I/F is an auxiliary arm 5 which sends and receives the substrate G to/from the exposing unit (not shown). Moreover, disposed on the interface unit I/F are an extension portion 6 which sends and receives the substrate G to/from the main arm 3 and a buffer unit 7 where the substrate G temporarily stands by.

Two main arms 3 are placed in series so as to be movable along the longitudinal direction in the center of the coating and developing apparatus 1. On both sides of a transferring path of each main arm 3, a first treatment unit group A and a second treatment unit group B are disposed, respectively. A joint portion 8 is located between the first treatment unit group A and the second treatment unit group B, the joint portion temporarily holding and cooling the substrate G.

In the first treatment unit group A, a scrubbing unit SCR for scrubbing the substrates G and a developing treatment unit DEV for developing the substrates G are placed side by side on one side of the cassette station C/S. On the opposite side to the scrubbing unit SCR and the developing treatment unit DEV for performing developing treatment across the transferring path of the main arm 3, two heat processing units HP, which are vertically disposed, and a UV treatment unit UV and a cooling unit COL, both of which are also vertically disposed, are adjacently located.

In the second treatment unit group B, a coating treatment unit COT for performing resist coating treatment and edge removing treatment is disposed. On the opposite side to the coating treatment unit COT across the transferring path of the main arm 3, an adhesion unit AD for performing hydrophobic treatment for the substrates G and a cooling unit COL, which are vertically disposed, and a heat processing unit HP and a cooling unit COL, which are vertically disposed, and two heat processing units HP, which are vertically disposed, are adjacently located. When the heat processing unit HP and the cooling unit COL are vertically disposed, the heat processing unit HP is located on the top and the cooling unit COL is located on the bottom, thereby preventing mutual thermal interference, which makes accurate temperature control possible.

The main arm 3 is provided with X-axis drive mechanism, Y-axis drive mechanism, Z-axis drive mechanism, and in addition rotating drive mechanism rotating on the Z-axis. The main arm 3 appropriately travels along a central passage in the coating and developing apparatus 1 and transfers the substrate G between each of treatment units. The main arm 3 transfers the substrate G before being treated into each treatment unit and transfers the substrate G after being treated out from each treatment unit.

In the coating and developing apparatus 1 according to the embodiment, the individual treatment units are integrally disposed so as to reduce the space and improve the efficiency of the treatments.

Figure 3:
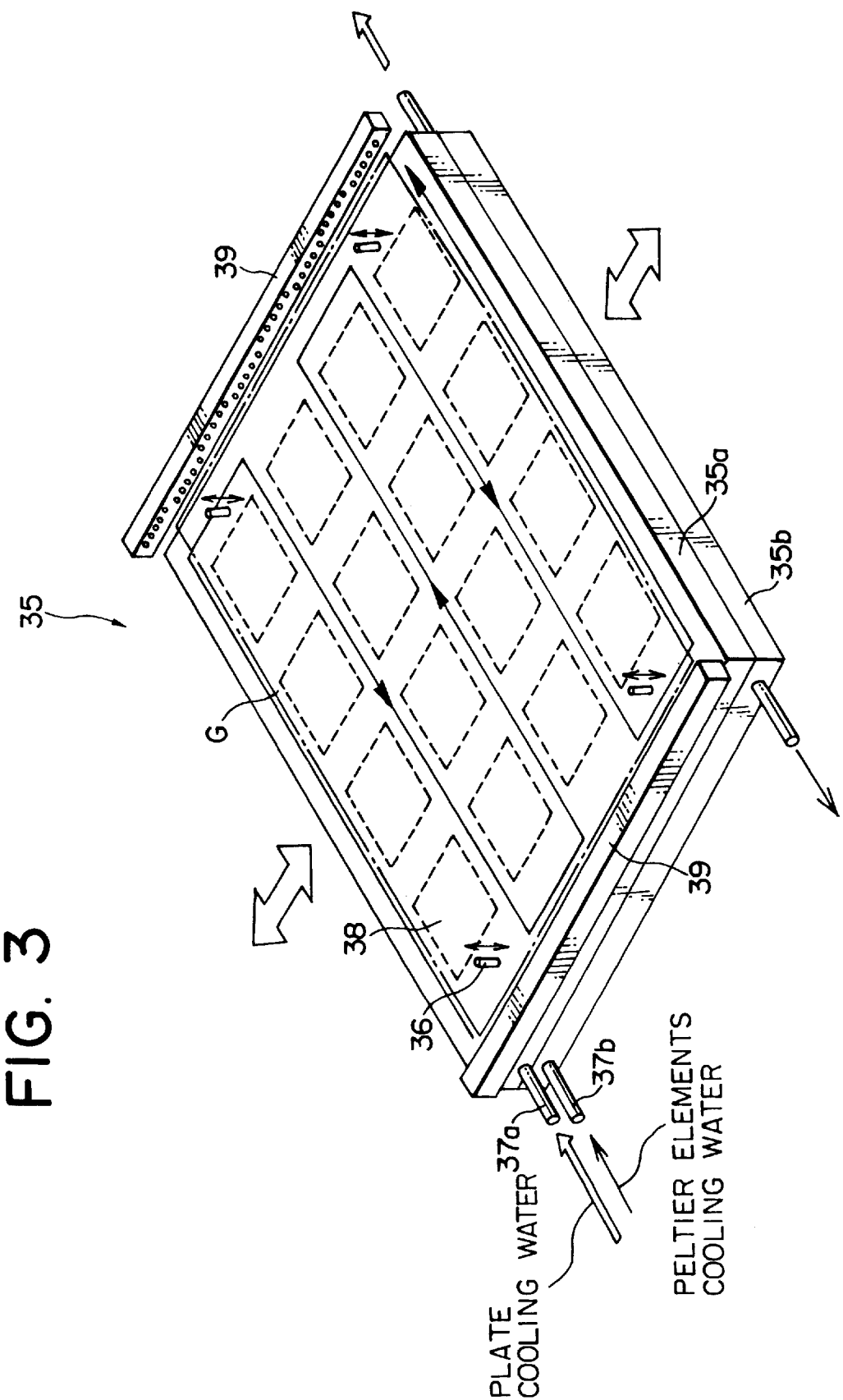
FIG. 3 is a perspective view showing a joint portion shown in FIG. 1 and FIG. 2.
Figure 4:
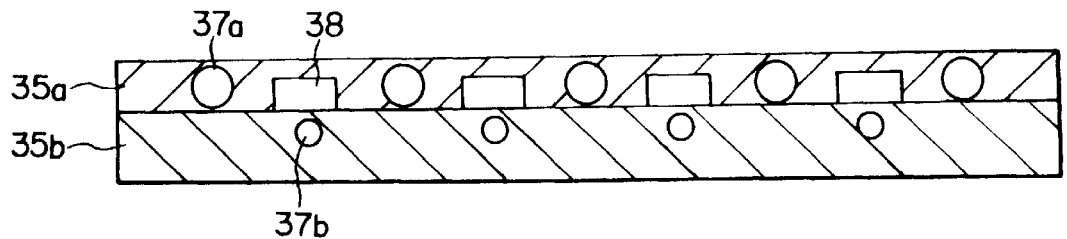
FIG. 4 is a vertical sectional view of FIG. 3.

FIG. 3 is a perspective view showing a joint portion 8 shown in FIG. 1 and FIG. 2. FIG. 4 is a vertical sectional view of FIG. 3.

A cooling plate 51 which serves as a supporting body to support the substrates G is disposed in the joint portion 8. Supporting pins 36 are provided on the four corners of the cooling plate 51. The supporting pin 36 vertically moves by means of drive mechanism (not shown). The supporting pin 36 receives the substrate G from the main arm 3 when rising and then descends, whereby the substrate G is landed on the cooling plate 51 and the substrate G and the cooling plate 51 are tightly attached. Subsequently the supporting pin 36 rises. In this situation, the supporting pin 36 sends the substrate G to the main arm 3.

The cooling plate 51, for example, has two-layer structure composed of an upper plate 35a and a lower plate 35b. Pipelines 37a for cooling water to cool the cooling plate 51 and the substrates G are laid in the upper plate 35a. Pipelines 37b for cooling water to cool Peltier elements 38 that are cooling elements are laid in the lower plate 35b.

More than one Peltier elements 38 are well-orderly disposed in the upper plate 35a in the cooling plate 51.

As described above, the cooling elements and the cooling water pipelines are employed together. Consequently, the substrates are cooled at relatively great speed by means of the cooling water and precisely cooled by means of the cooling elements, resulting in realization of rapid and high-precision cooling.

Ionizers 39 are placed on the both sides of the cooling plate 51. Ionized gas discharged from the ionizers 39 is blown against the substrates G that are located on the cooling plate 51, which can remove static electricity that is generated when the LCD substrate is tightly attached on the cooling plate 51, thus preventing electrostatic breakdown. Cooled inactive gas such as nitrogen gas is spouted out from the ionizers 39.

According to the embodiment, the substrates G, which are disposed on the supporting body in the joint portion 8 from the main arm 3, are cooled by means of a gas supplying member or a gas supplying circuit in the ionizers.

The substrates G in the joint portion 8 are transferred to the cooling unit COL where the substrates are further cooled. The substrates G are transferred after being cooled in the joint portion 8 for some time so as to shorten the time required for cooling, resulting in cooling at accurate temperatures.

Figure 5:
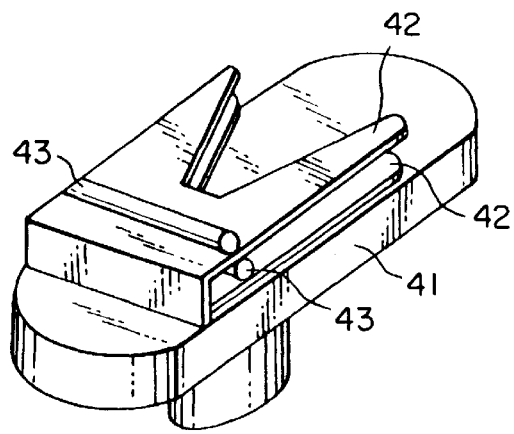
FIG. 5 is a perspective view showing a main arm shown in FIG. 1.
Figure 6:
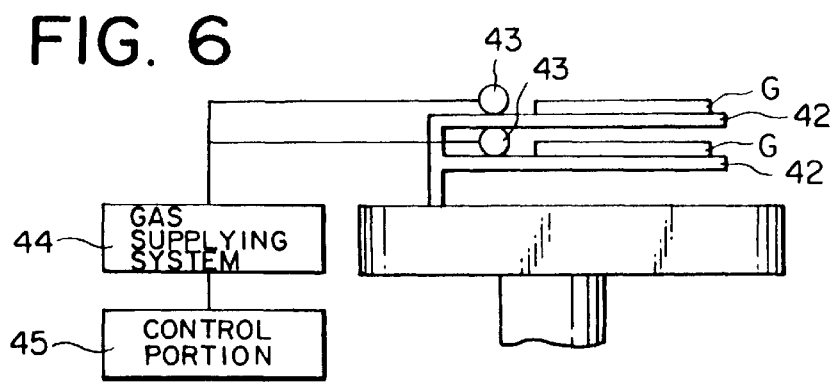
FIG. 6 is a side elevational view of FIG. 5.

FIG. 5 is a perspective view showing the above-described main arm 3. FIG. 6 is a side elevational view of FIG. 5. 41 in FIG. 5 shows a base which can move horizontally, rise and fall, and revolve. More than one (two in the embodiment) forks 42 which support the substrates G are placed overlapping each other on the base 41. A gas supplying member 43 serving as a cooling means is mounted on each of the forks 42.

A gas supplying system 44 is connected to the gas supplying members 43. Gas such as air, nitrogen gas and ionized gas is brought in from the gas supplying system 44, and the gas is supplied to the substrates G through the gas supplying members 43. When the substrate G touches the fork 42 on each surface while transferring, static electricity may be generated. However, since the static electricity can be removed, ionized gas is preferably employed for gas.

A control portion 45 is connected to the gas supplying system 44, the control portion controlling the conditions for blowing gas against substrates, for example, the amount, time or timing of blowing gas. Therefore, it is possible to control and cool the substrate to the desired level by means of substrate cooling by the supplied gas.

Figure 7:
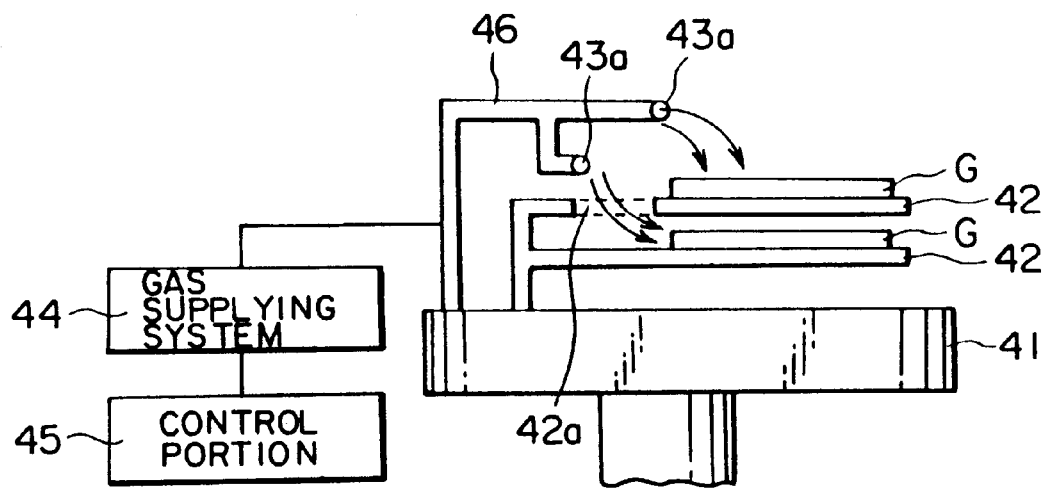
FIG. 7 is a side elevational view showing a main arm according to another embodiment.

In FIG. 5 and FIG. 6, the gas supplying members 43 are individually mounted on each of forks 42 and cool the substrates supported on the forks 42. As shown in FIG. 7, however, the substrates G supported on the forks 42 can be cooled by means of a gas supplying member 43 provided on the base 41 having more than one openings for blowing 43a corresponding to the number of the forks 42. In a way shown in FIG. 6, the cooling level of substrate G on each fork 42 can be individually controlled, while in a way shown in FIG. 7, substrates G on all forks 42 can be uniformly cooled. In the way shown in FIG. 7, hole portions 42a are formed in the forks 42 so as to supply gas to the substrates G through the hole portions 42a. In the way shown in FIG. 7 as well as in FIG. 6, the control portion 45 is connected to the gas supplying system 44 to control the conditions for blowing gas against substrates.

Figure 8:
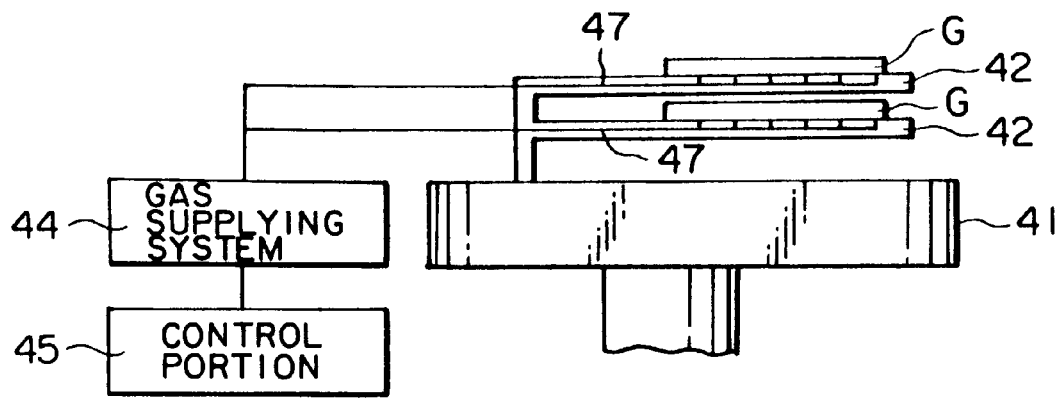
FIG. 8 is a side elevational view showing a main arm according to still another embodiment.
Figure 9:
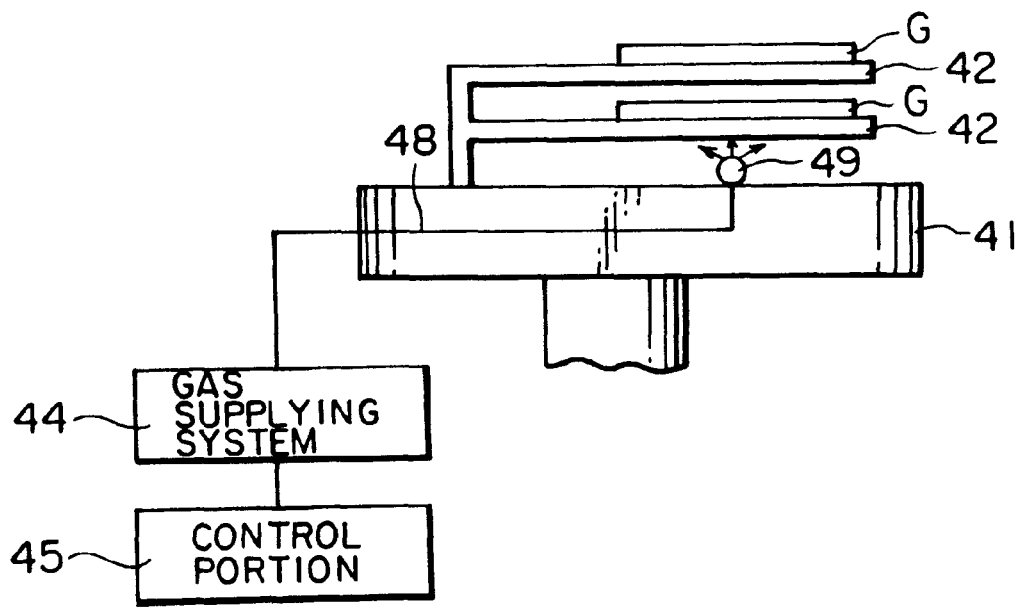
FIG. 9 is a side elevational view showing a main arm according to yet another embodiment.

In addition, as shown in FIG. 8, gas flow through-holes 47 are formed in the forks 42. From the gas flow through-holes 47, gas can be blown against the substrates G for cooling. Also as shown in FIG. 9, a gas flow through-hole 48 can be formed in the base 41 and a gas supplying member 43 connecting therewith is formed on the base 41 in the position just under the forks 42 and gas is supplied to the forks 42.

Figure 10:
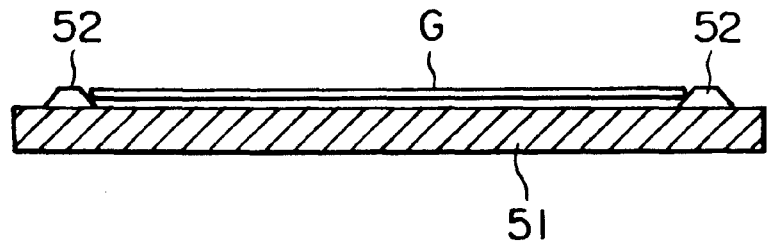
FIG. 10 is a schematic view for explaining an example of a cooling plate in a cooling unit.

The cooling unit COL has a cooling plate 51 as shown in FIG. 10. Supporting members 52 composed of members such as resin or rubber are mounted on the cooling plate 51. The supporting members 52 support the substrate G.

In the cooling plate 51, more than one cooling elements are disposed or cooling water circulating pipelines are laid. The substrate G placed on the cooling plate 51 is cooled by means of the cooling elements or cooling water circulating through the cooling water circulating pipelines. In this case, since more than one cooling elements are employed, the substrate of which surface heat is removed by a transferring member can be precisely cooled. Moreover, a cooling plate having both cooling elements and cooling water circulating pipelines is also available.

Next, the method for cooling a substrate of which the temperature is raised by means of a coating and developing apparatus having the foregoing structure will be described.

In a coating and developing apparatus 1 structured as described above, substrates G in cassettes 2 are transferred to a scrubbing unit SCR through an auxiliary arm 4 and a main arm 3 where scrubbing treatment is performed.

Subsequently, the substrates G are transferred to an adhesion unit AD through a joint portion 8 and the main arm 3 to be given hydrophobic treatment, whereby the fixing characteristic of the resist is improved.

Thereafter, the substrates G are transferred to a cooling unit COL through the main arm 3 and then transferred to a coating treatment unit COT through the main arm 3 to be coated with resist.

Next, the substrates G are transferred to a heat processing unit HP through the main arm 3 to be pre-baked. After being transferred to the cooling unit COL through the main arm 3 to be cooled, the substrates G are transferred to an exposing unit through the main arm 3 and an interface portion I/F where the predetermined pattern is exposed.

Exposed substrates G are transferred again into the apparatus 1 through the interface portion I/F and transferred to the heat processing unit HP through the main arm 3 where post-exposure bake process is performed.

Thereafter, the substrates G are transferred into the cooling unit COL through the main arm 3, the joint portion 8 and the main arm 3 to be cooled.

In the joint portion 8 and the main arms 3 structured as described above, the substrates G are cooled auxiliarily. At this time, the temperature level to lower the temperature of substrate is controlled by adjusting the amount, time, and timing of blowing gas with a control portion 45.

In the cooling unit COL, the substrate G is placed on a cooling plate 51 in the cooling unit COL so as to be cooled as shown in FIG. 10. Since the surface heat of the substrate G is already removed in the joint portion 8 and the main arm 3, the substrate G is cooled on the cooling plate 41 at lower speed than initial cooling, whereby the substrate G can be cooled with high accuracy. In this case, if cooling elements are used as cooling means, substrates can be cooled with higher accuracy. Moreover, the use of cooling plate 51 having cooling elements and cooling water circulating pipelines enables substrates to be cooled rapidly and accurately.

Thereafter, already cooled substrates G are transferred to a developing treatment unit DEV through the main arm 3 to be developed so as to form the predetermined circuit pattern. The developed substrates G are transferred to the UV treatment unit UV through the main arm 3 to be provided with UV treatment.

UV-treated substrates G are put in the predetermined cassettes 2 on the cassette station C/S through the main arm 3 and the auxiliary arm 4.

According to the present invention, while the substrate G of which the temperature is raised is transferred to the cooling unit COL, the first cooling is conducted in the joint portion 8 and the main arm 3 so as to previously remove surface heat of the substrate G, thus reducing the time of the second cooling. In addition, since the surface heat of the substrate G is removed while transferring, the range of the temperature fall caused by the second cooling becomes narrow, thereby facilitating temperature control by means of cooling elements and cooling water circulation and improving accuracy.

As described above, a substrate of which the temperature is raised is cooled to a certain temperature while being transferred, whereby the range of temperatures in cooling in a cooling unit becomes narrow, thus shortening the cooling time. Consequently, the cooling time in substrate cooling can be shortened so that tact time in substrate treatment can be reduced. Practically, the method according to the present invention enables tact time in substrate treatments to be shortened by twenty to thirty percent.

It is to be understood that the present invention is not limited to the above-described embodiment. Instead, various modifications of the present invention are available. For example, in the above-described embodiment, the present invention is applied to a coating and developing apparatus. The present invention, however, is not limited to the coating and developing apparatus, but can be applied to other treatments. In addition, in the above-described embodiment, a LCD substrate is employed for substrate. However, the present invention can be applied to treatments of other substrates such as a semiconductor wafer or the like.

What is claimed is:

1. A method of cooling a treatment substrate comprising the steps of:

(a) placing the treatment substrate in a standby position where the treatment substrate stands by before being transferred to a cooling unit and cooling the treatment substrate thereon in the standby position;

(b) transferring the treatment substrate from the standby position into the cooling unit; and (c) cooling the treatment substrate in the cooling unit.

2. The method according to claim 1, wherein in the step (a) the treatment substrate is cooled touching a cooled supporting body.

3. The method according to claim 2,
wherein the supporting body is a portion of a main arm for supporting the treatment substrate.

4. The method according to claim 2,
wherein the supporting body is a cooling plate placed on a joint portion between a first treatment unit group and a second treatment unit group.

5. The method according to claim 1,
wherein the step (a) includes the process of blowing ionized gas over the treatment substrate.

6. The method according to claim 5,
wherein the step (a) includes the process of blowing cooled gas after blowing the ionized gas.

7. A method of cooling a treatment substrate comprising the steps of:
(a) cooling the treatment substrate by a cooling means which moves together with the treatment substrate while being transferred to a cooling unit; and
(b) cooling the cooled treatment substrate in the cooling unit.

8. The method according to claim 7,
wherein in the step (a) the treatment substrate is cooled by blowing cooled gas over the treatment substrate.

9. An apparatus for cooling a treatment substrate comprising:
a cooling unit for cooling the treatment substrate;
a supporting body for supporting the treatment substrate before being transferred to said cooling unit; and
a cooling means for cooling the treatment substrate supported by said supporting body.

10. The apparatus according to claim 9, further comprising:
an ionizer for blowing ionized gas over the substrate treatment supported by said supporting body.

11. The apparatus according to claim 10,
wherein said ionizer spouts cooled gas.

12. The apparatus according to claim 11,
wherein the gas is inactive gas.

13. The apparatus according to claim 9,
wherein said cooling means possesses cooling elements disposed in said supporting body.

14. The apparatus according to claim 13,
wherein the cooling elements are Peltier elements.

15. The apparatus according to claim 9,
wherein said cooling means is provided with cooling elements disposed in said supporting body, pipelines laid in said supporting body and a means for circulating cooling water in the pipelines.

16. An apparatus for cooling a treatment substrate comprising:
a cooling unit for cooling the treatment substrate;
a transferring means for transferring the treatment substrate to said cooling unit; and
a cooling means which moves together with the treatment substrate for cooling the treatment substrate transferred by said transferring means.

17. The apparatus according to claim 16,
wherein said transferring means is provided with a movable base and a supporting body installed on the base for supporting the treatment substrate, and
wherein said cooling means includes a means for blowing gas installed on the base over the treatment substrate supported by the supporting body.

18. The apparatus according to claim 17,
wherein the supporting body is a main arm, and
said cooling means comprises a pipeline for blowing gas installed in the base, having an opening facing the treatment substrate supported by the supporting body, and a gas supplying system for supplying cooled gas to the pipeline for blowing gas.

19. The apparatus according to claim 17,
wherein the supporting body is a main arm, and
said cooling means comprises a pipeline for blowing gas installed in the base, having an opening facing the treatment substrate supported by the supporting body, and a gas supplying system for supplying cooled gas to the pipeline for blowing gas.

20. The apparatus according to claim 17,
wherein the supporting body comprises two sets of main arms including an upper main arm and a lower main arm each of which is driven independently, and
said cooling means comprises a pipeline for blowing gas installed in the main arm having an opening at a supporting portion of the main arm, and
a gas supplying system for supplying cooled gas to the pipeline for blowing gas.

21. An apparatus for treating a treatment substrate comprising:
a first treatment unit group including a cooling unit for cooling the treatment substrate;
a second treatment unit group for offering the treatment substrate the predetermined treatments;
a supporting body disposed between said first treatment unit group and said second treatment unit group for supporting the treatment substrate;
a cooling means for cooling the treatment substrate supported by the treatment substrate;
a transferring means for transferring the treatment substrate to the cooling unit; and
a cooling means for cooling the treatment substrate transferred by said transferring means.

22. The apparatus according to claim 21, further comprising:
a cooling means for cooling the treatment substrate while being transferred between the supporting body and the cooling unit by said transferring means.

23. The apparatus according to claim 21,
wherein the treatment substrate is made of semiconductor or insulative material, and
wherein said apparatus further comprises an ionizer for blowing ionized gas over the treatment substrate supported by said supporting body.

24. The apparatus according to claim 23,
wherein said ionizer spouts cooled gas.

25. The apparatus according to claim 23,
wherein the gas is an inactive gas.

26. The apparatus according to claim 21,
wherein said cooling means possesses cooling elements disposed in said supporting body.

27. The apparatus according to claim 26,
wherein said cooling elements are Peltier elements.

28. The apparatus according to claim 21,
wherein said cooling means is provided with cooling elements disposed in said supporting body and a means for circulating cooling water in the pipelines.

29. A cooling plate disposed on a joint portion between a first treatment unit group including a cooling unit for cooling the treatment substrate and a second treatment unit group for offering the treatment substrate the predetermined treatments, for cooling a treatment substrate while being put thereon temporarily, the cooling plate comprising:

an upper plate including a plurality of installed Peltier elements and having buried water pipelines for cooling the cooling plate and the treatment substrate to be put thereon on the upper plate; and a lower plate, connected to a lower surface of the upper plate, the lower plate including buried water pipelines for cooling the Peltier elements.

30. The method according to claim 7, wherein the step (a) is a step of cooling the treatment substrate while transferring the treatment substrate between a joint portion and a portion immediately in front of the cooling unit.

31. The method according to claim 7, wherein the step (a) is a step of cooling the treatment substrate while transferring the treatment substrate between a joint portion and a cooling portion in the cooling unit.

32. A method of cooling a treatment substrate comprising the steps of:

(a) cooling the treatment substrate by a cooling means which moves together with the treatment substrate while being transferred to a cooling unit;

(b) cooling the cooled treatment substrate in the cooling unit; and (c) blowing ionized gas to the cooled treatment substrate.

33. A method of cooling a treatment substrate comprising the steps of:

(a) blowing ionized gas to the treatment substrate;

(b) cooling the treatment substrate by a cooling means which moves together with the treatment substrate while being transferred to a cooling unit; and (c) cooling the cooled treatment substrate in the cooling unit.

34. A method of cooling a treatment substrate comprising the steps of:

(a) blowing ionized gas to the treatment substrate and simultaneously blowing ionized gas to a supporting body supporting the treatment substrate;

(b) cooling the treatment substrate by a cooling means which moves together with the treatment substrate while being transferred to a cooling unit; and (c) blowing ionized gas to the treatment substrate and simultaneously blowing ionized gas to the supporting body.

* * * * *